(12) United States Patent
Buck

(10) Patent No.: US 7,039,143 B2
(45) Date of Patent: May 2, 2006

(54) CIRCUIT FOR DETERMINING THE TIME DIFFERENCE BETWEEN EDGES OF A FIRST DIGITAL SIGNAL AND OF A SECOND DIGITAL SIGNAL

(75) Inventor: Martin Buck, München (DE)

(73) Assignee: Infineon Technologies AG, Munich (DE)

( * ) Notice: Subject to any disclaimer, the term of this patent is extended or adjusted under 35 U.S.C. 154(b) by 254 days.

(21) Appl. No.: 09/756,084

(22) Filed: Jan. 8, 2001

(65) Prior Publication Data

US 2001/0020854 A1 Sep. 13, 2001

Related U.S. Application Data

(63) Continuation of application No. PCT/DE99/02008, filed on Jul. 1, 1999.

(30) Foreign Application Priority Data

Jul. 8, 1998 (DE) ................................ 198 30 570

(51) Int. Cl.
*H04L 7/00* (2006.01)
(52) U.S. Cl. .................. 375/371; 327/159; 327/166
(58) Field of Classification Search ................ 375/354, 375/371, 375, 377; 327/141, 159, 161, 162, 327/163, 166; 326/93; 570/503
See application file for complete search history.

(56) References Cited

U.S. PATENT DOCUMENTS

| 4,721,905 | A | | 1/1988 | Mehrgardt | |
|---|---|---|---|---|---|
| 5,245,231 | A | | 9/1993 | Kocis et al. | |
| 5,818,890 | A | * | 10/1998 | Ford et al. | 375/371 |
| 6,040,725 | A | * | 3/2000 | Lee et al. | 327/175 |

FOREIGN PATENT DOCUMENTS

| DE | 195 06 543 C1 | 5/1996 |
|---|---|---|
| EP | 0 576 150 A2 | 12/1993 |
| EP | 0 576 150 A3 | 12/1993 |
| EP | 0 639 004 A1 | 2/1995 |

* cited by examiner

*Primary Examiner*—Dac V. Ha
(74) *Attorney, Agent, or Firm*—Laurence A. Greenberg; Werner H. Stemer; Ralph E. Locher

(57) ABSTRACT

The circuit has a first input for supplying a first signal (S1) to a series circuit made from a plurality of basic elements. Each basic element has a memory (M) for storing the signal level which is applied to the input of the basic element, and the output of a storage element (M) is connected to the input of a next basic element. Furthermore, the circuit has a second input for supplying a second signal (S2) which is connected to a control input of each basic element. Given a first level of the second signal, the storage elements (M) take up the signal level stored in the preceding storage element, and given a second level of the second signal, the storage elements (M) retain the signal level respectively stored in them. Furthermore, the circuit has comparator units (XOR) to which, in each case, the signal levels stored by the storage units (M) of two adjacent basic elements are supplied.

5 Claims, 2 Drawing Sheets

CIRCUIT FOR DETERMINING THE TIME DIFFERENCE BETWEEN EDGES OF A FIRST DIGITAL SIGNAL AND OF A SECOND DIGITAL SIGNAL

CROSS-REFERENCE TO RELATED APPLICATION

This is a continuation of copending International Application PCT/DE99/02008, filed Jul. 1, 1999, which designated the United States.

BACKGROUND OF THE INVENTION

Field of the Invention

The invention relates to a circuit for determining the time difference between edges of a first digital signal and of a second digital signal.

Such a circuit is described in DE-C1 195 06 543. In this circuit a first signal is supplied to a series circuit made from inverters. The outputs of two successive inverters in each case are connected to inputs of AND gates. The AND gates are activated and deactivated by means of a second signal. Given a positive edge of the second signal, the AND gates are activated, after which the latter indicate, by comparing their input signals which indicate at the time of their output, whether or not a positive edge of the first signal has already passed through the inverters in the series circuit which are connected to them. The output signals of the AND gates are stored in flip-flop circuits.

SUMMARY OF THE INVENTION

It is accordingly an object of the invention to provide a circuit of the type mentioned at the beginning for which a smaller number of circuit components is required than in the aforesaid prior art.

The circuit according to the invention for determining the time difference between edges of a first digital signal and of a second digital signal has a first input for supplying the first signal to a series circuit made from a plurality of basic elements. Each of the basic elements has a storage unit for storing the signal level which is applied to the input of the basic element, the output of the storage element being connected to the input of the next basic element. Furthermore, the circuit has a second input for supplying the second signal which is connected to a control input of each basic element. Given a first level of the second signal, the storage elements take up the signal level stored in the preceding storage element, and given a second level of the second signal the storage elements retain the signal level respectively stored in them. Furthermore the circuit has comparator units to which in each case the signal levels stored by the storage units of two adjacent basic elements are supplied, in response to which the comparator units supply appropriate result signals at their outputs. In this context, the comparator units provide in each case a different event signal when two identical signal levels are supplied than when two different signal levels are supplied.

The invention therefore provides that the storage units are configured within the series circuit made from basic elements, that is to say in the signal path of the first signal. The series circuit of the basic elements serves to determine the time between the occurrence of an edge of the first signal at the input of the series circuit and the occurrence of an edge of the second signal, and has the function of a delay line. The storage elements which are integrated in this series circuit and which respectively bring about a delay in the signal level at their output in comparison with the signal level stored in them contribute to the propagation time delay of the edge of the first signal.

The storage elements therefore perform two functions: firstly they store the information which indicates how far the edge of the first signal has passed through the series circuit of the basic elements until the occurrence of the edge of the second signal, and secondly they delay the edge of the first signal which propagates through the series circuit made from the basic elements. In contrast, in DE-C1 195 06 543, mentioned at the beginning, various components are responsible for delaying the first signal in a series circuit and for storing the result determined when the edge of the second signal occurs. In the aforesaid publication, these are inverters in the first case and flip-flops in the second case. For this reason, the circuit according to the invention requires, in comparison with the above mentioned prior art, fewer components because of the double function of its storage elements.

Other features which are considered as characteristic for the invention are set forth in the appended claims.

Although the invention is illustrated and described herein as embodied in a circuit for determining the time difference between edges of a first digital signal and of a second digital signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
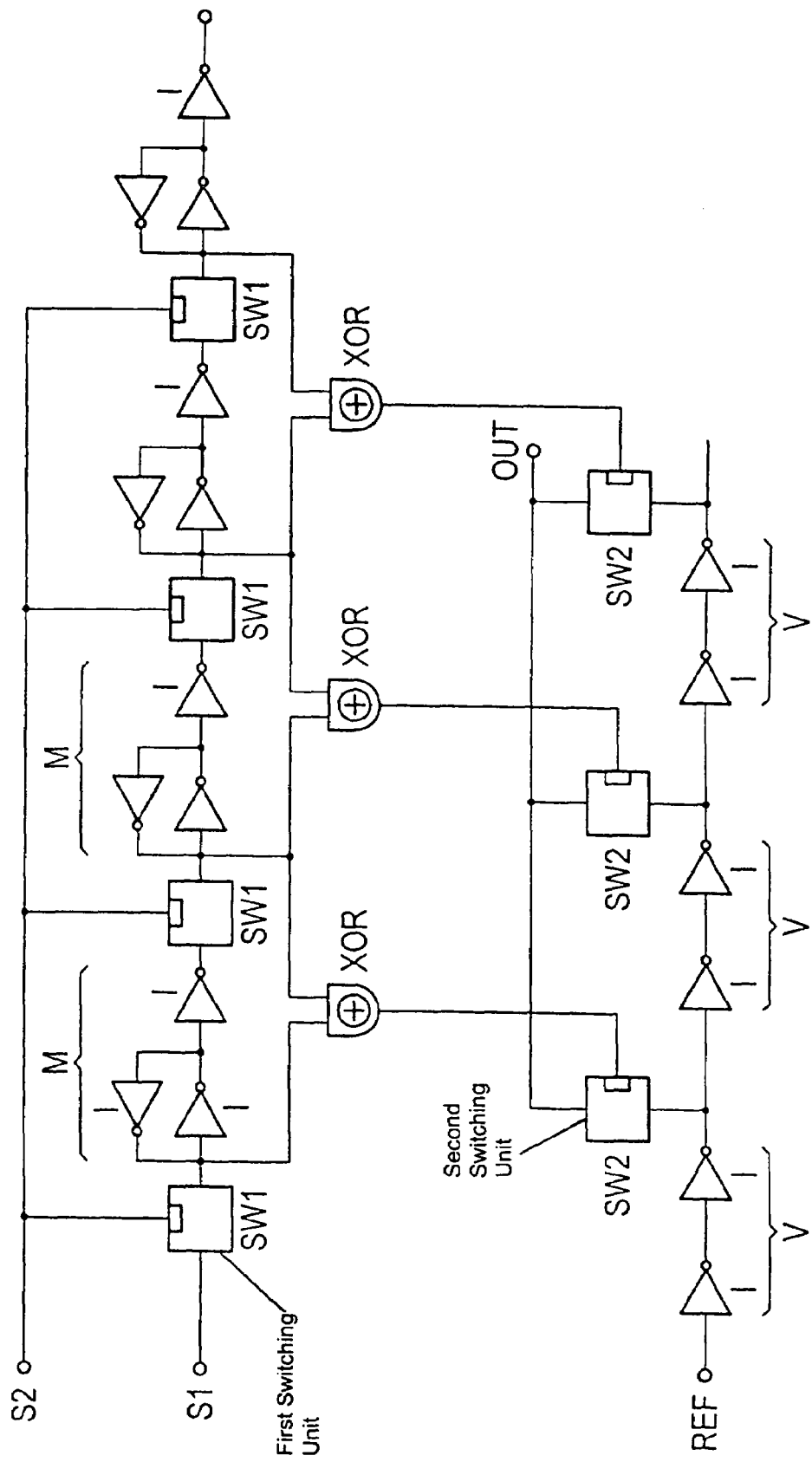
FIG. 1 shows an exemplary embodiment of the invention.

Referring now to the figures of the drawing in detail and first, particularly, to FIG. 1 thereof, there is shown a series circuit made from basic elements, each of which contains a first switching unit SW1 and a storage unit M. Each storage unit M has two inverters I which are configured in antiparallel and which form a hold circuit, and a further inverter I which is connected downstream of the latter. A first signal S1 is supplied to the input of the series circuit made from the basic elements. When all of the first switching units SW1 are supplied with power, an edge of the first signal S1 passes through the series circuit made from the basic elements and in doing so is delayed by the inverters I of the storage units M. Each one of the first switching units SW1 has a control input which is connected to a second signal S2. The switching state of the first switching units SW1 is determined by the signal level of the second signal S2. This is explained below with reference to FIG. 2.

Figure 2:
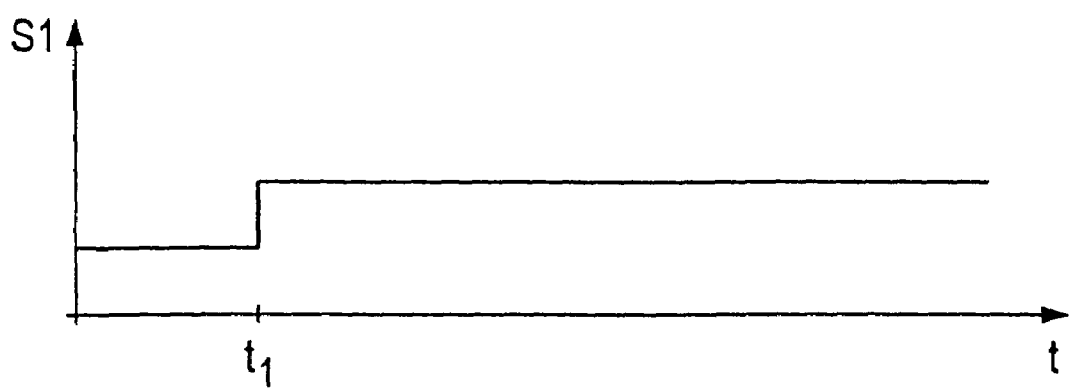
FIG. 2 shows the signal profiles of the first and second signals from FIG. 1.
Figure 2:
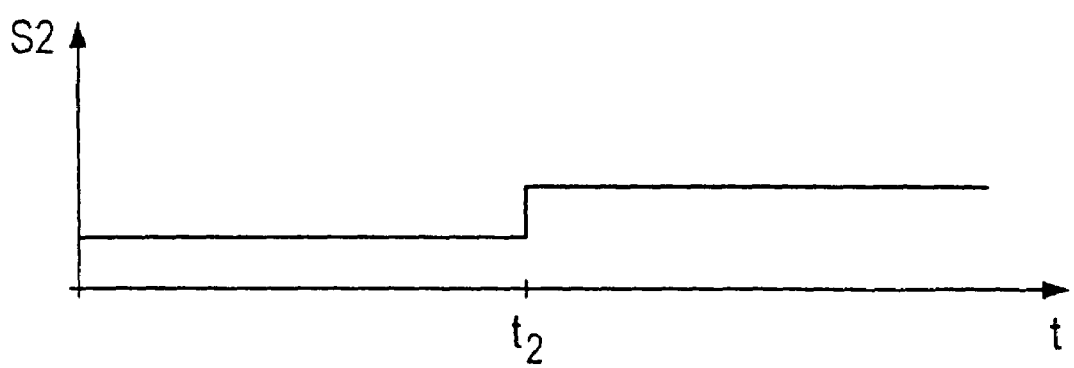

FIG. 2 shows the signal profiles of the two signals S1, S2. Before a first time $t_1$ both signals S1, S2 have a low level. In the present case, the low level of the second signal S2 causes all of the first switching units SW1 to be supplied with power. For this reason, the low level of the first signal S1 is stored in all of the storage units M. At the first time $t_1$, the first signal S1 has a positive edge which is transmitted by the series circuit made from the basic elements. Here, the first switching units SW1 are supplied with power because of the low level of the second signal S2. At a second time $t_2$, the second signal S2 changes from the low level to a high level which causes all of the first switching units SW1 to be disabled simultaneously. As a result of this, at the second time $t_2$ the storage units M respectively retain the signal level stored in them. The effect of this is that those storage units M up to which the positive edge of the first signal SW1 has propagated by the time $t_2$ store a different level than the following storage units M.

In FIG. 1, the inputs of two adjacent storage units M are respectively connected to inputs of an XOR gate. A high level is generated at the output of the XOR gates only if the two signal levels which are supplied to them and which are stored in the appropriate storage units M differ from one another. For this reason, the XOR gates can be used to determine how far the positive edge of the first signal S1 has propagated through the series circuit made from the basic elements before the positive edge of the second signal S2 has occurred. The output signals of the XOR gates therefore indicate the amount of delay of the edge of the second signal S2 in comparison with the edge of the first signal S1.

In order to evaluate further the output signals of the XOR gates, further components of the circuit according to the invention may be provided, as illustrated in FIG. 1. The circuit in FIG. 1 has a series circuit made from a plurality of delay elements V. Each delay element contains a series circuit made from two inverters I. The output of each delay element V is connected to an output OUT via a second switching unit SW2. The delay elements V and the second switching units SW2 form a delay unit whose input is the input of the series circuit made from the delay elements V. The input of the delay element is supplied with a reference signal REF. The second switching units SW2 each have a control input which is connected to the output of, in each case, one of the XOR gates. After the occurrence of the positive edge of the second signal S2 at the second time $t_2$, just one output signal of the XOR gates has a high level. The second switching units SW2 are disabled if a low level is supplied to their control input, and they are conductive if a high level is supplied to them. For this reason, at the second time $t_2$ just that second switching unit SW2 whose XOR gate supplies a high level at its output is conductive. Edges of the reference signal REF are output to the output OUT of the delay unit with a delay resulting from the delay elements V. The degree of delay here is dependent on how many of the delay elements V have been passed through. This is determined in turn by which of the second switching elements SW2 is respectively conductive. This results in the delay of the reference signal REF being set by the delay unit as a function of the output signal of the XOR gates, and thus as a function of the time difference between the edges of the two signals S1, S2.

A clock signal is particularly suitable as the reference signal REF. The first and the second switching units SW1, SW2 may be implemented, for example, by means of transistors. These may be, in particular, transfer gates. Different storage units M from those shown in FIG. 1 may also be used. In all cases, the configuration of the series circuit made from the basic elements, which is shown in the upper part of FIG. 1, has the advantage that the storage units M contained in it not only perform their storage function but also delay the edge of the first signal S1 within the series circuit made from the basic elements. The storage units M therefore carry out a double function. It is thus possible to dispense with additional delay elements in the series circuit or with additional storage means outside the series circuit made from the basic elements, with the result that the circuit shown requires relatively few components.

In contrast with FIG. 1, the basic elements may include not only the storage units M and the first switching units SW1, but also further delay units, for example in the form of further inverters, in order to achieve longer delay times at each basic element. The way of implementing the storage units M illustrated in FIG. 1 by means of three inverters I has the advantage of a particularly simple design with only a small number of components. At the same time, the series circuit made from the inverters I within the storage units M has the advantage, as in customary delay circuits, of simple and precise setting of the desired propagation times of the first signal S1 by means of the series circuit.

I claim:

1. A circuit for determining a time difference between edges of a first digital signal and of a second digital signal, the circuit comprising:

a first input for receiving a first signal;

a plurality of basic elements connected in succession and in series, each one of said plurality of basic elements having an input, a control input, and a storage unit with an output, said plurality of basic elements including a first basic element having an input connected to said first input for receiving the first signal, said input of each one of said plurality of basic elements, except that of said first basic element, connected to said output of a respective preceding one of said plurality of basic elements;

a second input for receiving a second signal, said second input connected to said control input of each one of said plurality of basic elements; each one of said plurality of basic elements, except for said first basic element, configured such that if the second signal has a first level, said storage unit will store a signal level that is already stored in said storage unit of an immediately preceding one of said plurality of basic elements, and if the second signal has a second level, said storage element will retain a previously stored signal level; and a plurality of comparator units having outputs, each one of said plurality of comparator units receiving the signal level stored by said storage elements of two adjacent ones of said plurality of basic elements, each one of said plurality of comparator units supplying a different event signal at said output thereof when two identical signal levels are received from said storage elements of two adjacent ones of said plurality of basic elements than when two different signal levels are received.

2. The circuit according to claim 1, wherein each one of said plurality of basic elements includes a first switching unit connected in series with said storage element, said first switching unit of each one of said plurality of basic elements having a control input defining said control input of a respective one of said plurality of basic elements.

3. The circuit according to claim 1, wherein each one of said plurality of comparator units is an exclusive or gate.

4. The circuit according to claim 1, comprising:

a delay unit having an input for receiving a reference signal and having an output;

said delay unit including a plurality of delay elements connected in series, each one of said plurality of delay elements having an output;

said delay unit including a plurality of second switching units, each one of said plurality of second switching units configured between the output of a respective one of said plurality of delay elements and said output of the delay unit; and each one of said plurality of second switching elements having a control input connected to the output of a respective one of said plurality of comparator units.

5. The circuit according to claim 1, wherein said storage unit of each one of said plurality of basic units includes two inverters connected antiparallel.

* * * * *